United States Patent [19]

Huykman

[11] 4,321,487
[45] Mar. 23, 1982

[54] COMMON MODE REJECTION COUPLER

[75] Inventor: Richard B. Huykman, Lincoln Park, N.J.

[73] Assignee: Reliance Electric Company, Cleveland, Ohio

[21] Appl. No.: 137,713

[22] Filed: Apr. 7, 1980

[51] Int. Cl.³ .................. H03F 3/45; G02B 27/00; H03K 3/42
[52] U.S. Cl. .................. 307/311; 250/551; 307/475; 330/258
[58] Field of Search .............. 307/311, 475; 250/551; 330/258

[56] References Cited

U.S. PATENT DOCUMENTS

| | | | |
|---|---|---|---|
| 3,315,176 | 4/1967 | Biard | 330/258 |
| 3,810,034 | 5/1974 | Brunsch | 250/551 |
| 3,912,951 | 10/1975 | Kihara | 250/551 |
| 4,037,170 | 7/1977 | Richards | 330/258 |
| 4,063,121 | 12/1977 | Bartlett | 250/551 |

OTHER PUBLICATIONS

"Instrumentation Amplifier Conditions Computer Inputs", by Thomas C. Lyerly, Electronics, Nov. 6, 1972, pp. 115-118.

Primary Examiner—Harold A. Dixon
Attorney, Agent, or Firm—Charles R. Donohoe; Kenneth Watov

[57] ABSTRACT

A common mode rejection coupler having a pair of optical isolator circuits for receiving input signals which are the complement of one another. The optical isolator circuits generate output signals which are the complement of one another and which are normally isolated from a common mode voltage existing between the input and output of the isolators. The complementary outputs of the optical isolator circuits are shaped and one output is inverted so that both signals are in-phase with one another. The signals are coupled to a voltage divider circuit the output of which is coupled to a Schmitt Trigger. The output of the Schmitt Trigger is in a first state when both signals are high and in a second state when both signals are low. Should a spurious voltage spike be generated at the output of one of the isolator circuits due to a changing common mode voltage, the resulting input signal to the Schmitt Trigger will not change a sufficient amount to cause a change in state of the output of the Schmitt Trigger.

8 Claims, 3 Drawing Figures

COMMON MODE REJECTION COUPLER

BACKGROUND OF THE INVENTION

This invention relates to a common mode rejection coupler for electrically isolating the input of an electrical system from its output.

The difficulty of coupling a low level signal to a circuit having a transient high level common mode voltage is known in the art. In high voltage or high power switching systems, a low level input logic control circuit provides control signals for an output high level power switch control circuit. Typically, the reference potential of the high level output circuit changes by several hundred volts with respect to the ground potential of the low level control circuit when switching occurs. The potential difference between the floating reference of the high level switching circuit and the ground of the low level control system is termed the common mode voltage. Among techniques known in the art for effectively rejecting common mode voltages while at the same time effectively utilizing low level signals in systems having high common mode voltages include the use of magnetically coupled current transformers, differential amplifiers and various systems which convert the low level signal into another form of signal which can be controlled or monitored at some remote point. The circuits have some limitations particularly because of low frequency response in the case of a transformer coupling, the inapplicability of differential amplifiers to isolate high common mode voltages, and the lack of flexibility when utilizing other systems known in the art.

More recently, as disclosed in Broderick et al., U.S. Pat. No. 3,978,343, and in Loucks, U.S. Pat. No. 4,032,843, optically coupled isolators have been utilized to reject common mode voltages. In its basic form an optically coupled isolator includes a light emitting diode or similar current-to-light transducer which generates light having an intensity which is proportional to the current. The light thus generated is directed to a photosensitive device via an optical path which typically is in the form of a fiber optic bundle. The photosensitive device in turn generates a current which is proportional to the light intensity. Since the optical path is inherently an insulating medium of very high resistivity, such a device has the capability of isolating rather high common mode voltages. Accordingly, these devices have been utilized in solid state switching systems particularly where a low level logic control circuit controls a high power switching circuit.

However, one of the problems encountered with the prior art optically coupled isolator circuits is that the higher frequency common mode components, i.e., the frequency components generated when the common mode voltage rapidly switches from a first level to a second level, can be capacitively coupled via the stray capacitance between the light emitting diode and the light sensing diode in the electrical circuit. Accordingly, this rapid transition in the common mode voltage can result in the generation of undesirable spurious or transient signals by the optical isolator which can then be passed through the system to effect the operation of the isolated switching circuitry.

In the example of power switching systems, as aforementioned, the power switching circuitry is controlled by low level logic control circuitry. The reference potential of the high power switching circuitry floats with respect to the low level logic control circuitry such that the common mode voltage can vary in the range of ±100 to 500 volts in a few microseconds. Because of these high voltage transitions, the stray capacitance between the light emitting diode and the light sensitive diode causes a signal corresponding to the change in common mode voltage, i.e., the voltage differential, to be coupled to the high power switching circuitry which might therefore cause faulty switching of the high power switching circuitry. There accordingly is a need in the art for an improved common mode rejection coupler to eliminate spurious signals resulting from transitions in the common mode voltage.

Copending U.S. patent application S.N. filed concurrently herewith and which is assigned to the common assignee herewith discloses one such system for rejecting spurious or transient signals caused by rapid changes in the common mode voltage.

SHORT STATEMENT OF THE INVENTION

This invention relates to an improved common mode rejection coupler having a pair of optical isolator circuits for receiving input signals which are the complement for another. The optical isolator circuits generate output signals which are the complement of one another and which are normally isolated from a common mode voltage existing between the input and output of the isolators.

The complementary outputs of the optical isolator circuits are shaped and one output is inverted so that both signals are in phase with one another. These signals are coupled to the divider circuit the output of which is coupled to a bistable circuit such as a Schmitt Trigger. When both shaped signals are high, the output of the bistable circuit is in a first state; when both shaped signals are low, the output of the bistable circuit is in a second state.

Should the common mode voltage change, a spurious voltage spike may be generated at the output of one of the isolator circuits thus changing the state of one of the signals coupled to the bistable so that one signal is high and the other is low. The input to the bistable will accordingly be one-half the value of the high signal. This will be an insufficient change of value to cause change of state of the bistable which is set to require a change of greater than one-half of the input signal in order to change the output state of the bistable circuit. Since spurious transitions can occur at the output of only one of the isolator circuits due to changes in the common mode voltage, the present invention effectively rejects such spurious signal transitions.

BRIEF DESCRIPTION OF THE DRAWINGS

Other objects, features and advantages of the present invention will become more fully apparent from the following detailed description of the preferred embodiment, the appended claims and the accompanying drawings in which:

DETAILED DESCRIPTION OF THE PREFERRED EMBODIMENT

Figure 1:
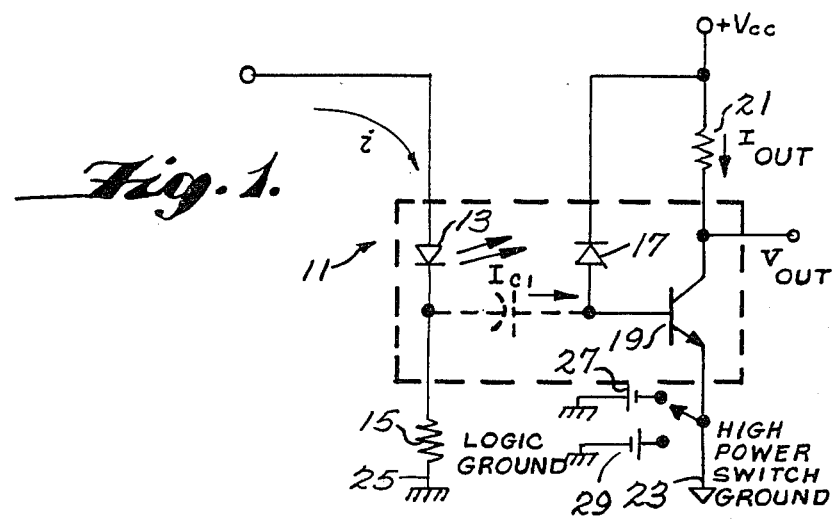
FIG. 1 is a schematic illustration of a prior art optical isolator circuit.

Refer now to FIG. 1 which is a schematic illustration of a known optical isolator circuit. As illustrated, the optical isolator circuit includes an input circuit 11 for applying an input voltage across a light emitting diode 13 and a current limiting resistor 15. A light sensing diode 17 is disposed in the path of radiation emanating from the light emitting diode 13 and produces an output signal which is proportional to the current conducted through the diode 13. The light sensing diode 17 is reverse biased by means of a potential $V_{cc}$ derived from a power supply. The electrical current thus generated by the light sensing diode 17 is coupled to an amplifier which in the illustrated embodiment is a transistor 19 but which can be any suitable amplifier circuitry known in the art.

The transistor 19, light sensitive diode 17 and load resistor 21 are referenced to a floating ground 23 while the light emitting diode 13 and current limiting resistor 15 are connected to a fixed reference ground 25. When the circuitry illustrated is utilized in a power switching system, the floating reference 23 becomes the high power switch ground which, as illustrated by means of the batteries 27 and 29, can vary between, for example, ±100–500 volts in a few microseconds. While this voltage range is set out here by way of example, it should be understood that other voltage ranges can be experienced by the optical isolator circuit illustrated in FIG. 1.

The drawback to the circuit illustrated in FIG. 1 is that a stray capacitance $C_i$ is established between the light emitting diode 13 and the light sensing diode 17. As a consequence of this stray capacitance, changes in the common mode voltage, i.e., changes in the voltage difference between the floating ground 23 and the fixed reference ground 25, are capacitively coupled by means of the stray capacitance $C_i$ into the circuit of the light sensing diode 17 and as differentiated by the capacitor $C_i$ will appear as a transient or spurious voltage across the load resistor 21 at the output of transistor 19. In order to overcome the problem of changes in the floating ground level 23, i.e., changes in the common mode voltage being coupled through the amplifier circuit, an improved system for isolating the input circuitry from the output circuitry has been developed by applicant.

Figure 2:
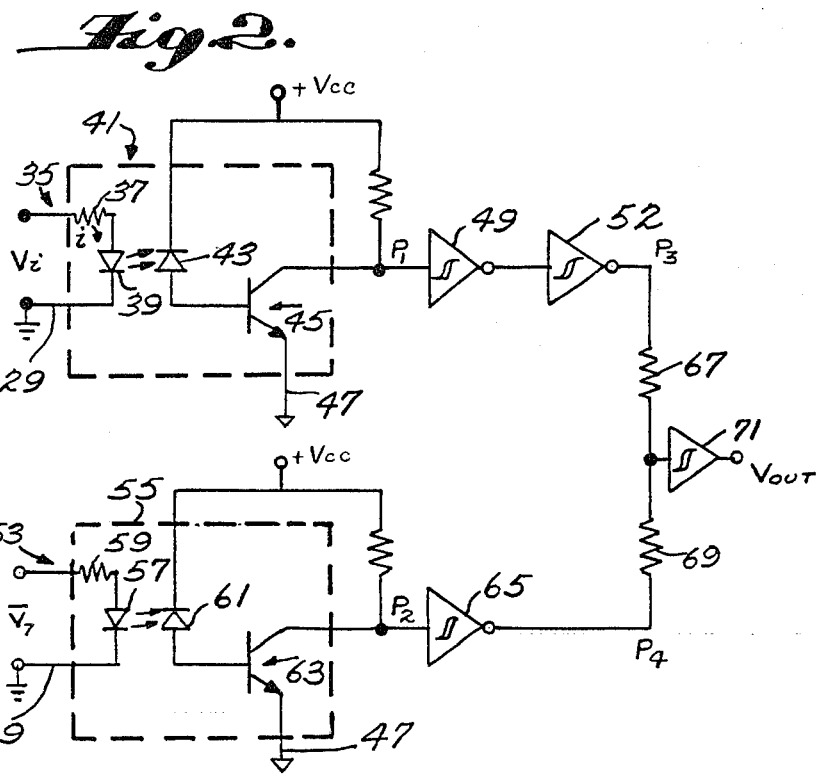
FIG. 2 is a schematic diagram of the preferred embodiment of the present invention.

Refer now to FIG. 2 which is a schematic block diagram of a preferred embodiment of the present invention. As illustrated in FIG. 2, an input voltage $V_i$ which may be a low level logic control signal in a power switching system is coupled to an input circuit 35 of an optical isolator circuit 41. The input circuit includes a current limiting resistor 37 and a light emitting diode 39. As aforementioned, the voltage $V_i$ generates a current i which causes light to be emitted by diode 39 having an intensity which is proportional to the current level. The light is directed toward light sensing diode 43 by fiber optics or other means known in the art. The current generated by the light sensing diode 43 in turn is proportional to the input voltage $V_i$. This current drives amplifier 45 which may be of any type well-known in the art, but, as illustrated, is a conventional bipolar transistor. The emitter of transistor 45 is connected to a floating reference 47 whereas the input circuit 35 is referenced with respect to a fixed ground 29.

The output signal of the optical isolator 41 is coupled to a signal shaping circuit 49 which in the preferred embodiment is a Schmitt Trigger. The output of the signal shaping circuit 49 is coupled to an inverter 51. The inverter can be of any type known in the art, however, in the preferred embodiment it is a Schmitt Trigger of the same type as signal shaper 49.

An input circuit 53 of a second optical isolator 55 receives the complement of voltage $V_i$, i.e., $\overline{V_i}$, which is coupled across a light emitting diode 57 and a current limiting resistor 59. The input circuit 53 is referenced with respect to the fixed ground 29. On the output side of the optical isolator circuit 55 is a light sensitive diode 61, the output of which drives transistor amplifier 63. The output of optical isolator circuit 55 is referenced with respect to the floating ground 47 which, as aforementioned, may vary ±100–500 volts with respect to the fixed ground 29 in a power switching system. The output of the optical isolator 55 is connected to a wave shaping circuit 65 which preferably is identical to wave shaping circuit 49.

The outputs of the inverter 51 and the wave shaping circuit 65 are coupled to a voltage divider circuit formed of resistors 67 and 69. The output of the voltage divider circuit is coupled to a bistable circuit 71 which may, for example, be a Schmitt Trigger. The resistors which form the voltage divider are of equal value so that if the two signals coupled thereto are high, the input to the Schmitt Trigger will be high, and if the two signals are low, the input to the Schmitt Trigger will be low. However, if one of the two signals coupled to the voltage divider circuit is high and the other is low, the input to the Schmitt Trigger will be one-half the value of the sum of the high and low signals. For example, if the high signal is represented by the voltage V and the low signal is 0 volts, the input to the Schmitt Trigger will be the voltage V when both signals are high, 0 volts when both signals are low and 0.5 V volts when one of the signals is high and the other is low.

The Schmitt Trigger is set to change output states only when there is a change in the magnitude of the input voltage of 0.6 V or greater. Thus, when the input voltage to the Schmitt Trigger is 0 volts, the output thereof is 0 volts and will remain at 0 volts until the input voltage goes above at least 0.6 V volts. Thus, when a spurious signal is coupled to the output of one or the other of the optical isolators as a result of a change in the common mode voltage, the input voltage to the Schmitt Trigger 71 will change from 0 volts to 0.5 V volts. This is insufficient to cause the Schmitt Trigger to change its output state and, accordingly, the spurious signal is rejected. The voltage divider circuit and the Schmitt Trigger operate together as a discriminator which rejects spurious changes in one of the signals generated by the optical isolator circuits.

Figure 3:
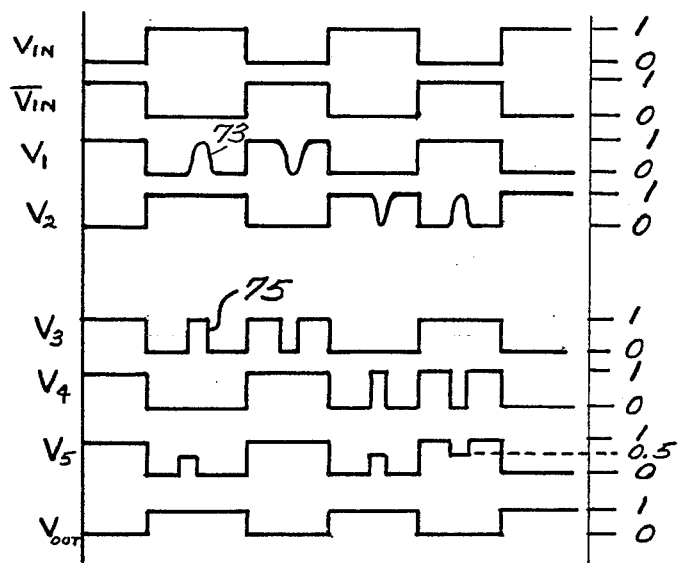
FIG. 3 is a graphical display of a set of waveforms associated with the circuitry of FIG. 2.

Refer now to FIG. 3 which is an illustration of the waveforms associated with the circuitry of FIG. 2. The waveform $V_{in}$ is the input waveform to the optical isolator 41 and the waveform $\overline{V_{in}}$ is the input voltage $\overline{V_i}$ to the optical isolator circuit 55. As illustrated, these signals are the complement of one another. Waveform $V_1$ is the output signal of the optical isolator circuit 41 at point $P_1$ and the waveform $V_2$ is the output of optical isolator circuit 55 at point $P_2$. Waveform $V_3$ represents the output of inverter circuit 51 at point $P_3$ and waveform $V_4$ is the output of wave shaping circuit 65 at point $P_4$. As illustrated in FIG. 3, the waveforms $V_3$ and $V_4$ are in-phase. Waveform $V_5$ is the output of the voltage divider circuit comprising resistors 67 and 69, and voltage $V_{out}$ is the output voltage of the Schmitt Trigger 71.

In operation assume, for example, that the common mode voltage between floating reference 47 and the fixed ground 29 goes positive. A positive going transient spike signal 73 will be coupled to the output of the optical isolator circuit 41 because of the stray capacitance $C_i$ therein. This transition in the output of isolator 41 is shaped, inverted and appears as a spurious signal 75 at point $P_3$. The voltage divider circuit 67 and 69 reduces the level of the spurious signal to 0.5 V. As aforementioned, the output state of the Schmitt Trigger 71 cannot be changed by such a signal and, accordingly, the spurious signal does not appear at the output of the Schmitt Trigger 71. It can be seen from the waveforms of FIG. 3 that similar spurious signals in other portions of the output waveforms of the optical isolators 41 and 55 are rejected because such signals will appear in only one of the two waveforms $V_3$ and $V_4$ and hence will be insufficient to change the state of the Schmitt Trigger.

While the present invention has been disclosed in connection with a preferred embodiment thereof, it should be appreciated that there may be other embodiments which fall within the spirit and scope of the present invention as defined by the appended claims.

What is claimed is:

1. In a circuit having a common mode voltage between the input and output thereof, a common mode rejection coupler comprising:
   a first circuit means for receiving an input signal and for generating a first signal in response thereto, said first circuit means normally isolating said first signal with respect to said common mode voltage;
   a second circuit means for receiving the complement of said input signal and for generating a second signal in response thereto, said second circuit means normally isolating said second signal with respect to said common mode voltage, said second signal being the complement of said first signal;
   means for inverting one of said first and second signals, said first and second signals being thereby in-phase with one another; and
   discriminating means receiving said in-phase first and second signals for generating an output signal having first or second states, said discriminating means changing the state of said output signal only when both of said in-phase signals change state, spurious changes in the state of only one of said first and second signals being ineffective to change the state of said output signal.

2. In a circuit having a common mode voltage between the input and output thereof, a common mode rejection coupler comprising:
   a first circuit means for receiving an input signal and for generating a first signal in response thereto, said first circuit means normally isolating said first signal with respect to said common mode voltage;
   a second circuit means for receiving the complement of said input signal and for generating a second signal in response thereto, said second circuit means normally isolating said second signal with respect to said common mode voltage, said second signal being the complement of said first signal;
   wave shaping means for converting said first and second signals to first and second square waves signals having first and second states;
   means for inverting one of said first and second square wave signals, said first and second square wave signals being thereby in-phase with one another; and
   discriminating means receiving said in-phase first and second square wave signals for generating an output signal having first or second states, said disciminating means changing the state of said output signal only when both of said in-phase signals change state, spurious changes in the state of only one of said first and second signals being ineffective to change the state of said output signal.

3. The common mode rejection coupler of claim 2 wherein said discriminating means comprises means for dividing said first and second square wave signals by a predetermined amount, and bistable means responsive to said divided square wave signals for generating a first output signal when the output of said divider is greater than a predetermined amount, for generating a second output when said divided square wave output of said divider means is less than a second value and for maintaining the current output state when the divided square wave output of said divider means is between said first and second values.

4. The common mode rejection coupler of claim 3 wherein said first and second circuit means each comprises an optical isolator circuit having an input circuit for receiving said input signal, said input circuit including a light emitting diode and being referenced to a fixed ground; and
   an output circuit including a light sensor diode for receiving a light generated from said light emitting diode and for generating a signal proportional to the intensity of said light, a common mode voltage existing between said input and said output circuits and said input and output circuits being capacitively coupled.

5. In a circuit having a common mode voltage between the input and output thereof, a common mode rejection coupler comprising:
   a first circuit means for receiving an input signal and for generating a first signal in response thereto said first circuit means normally isolating said first signal with respect to said common mode voltage;
   a second circuit means for receiving the complement of said input signal and for generating a second signal in response thereto, said second circuit means normally isolating said second signal with respect to said common mode voltage, said second signal being the complement of said first signal, said first and second circuit means generating transient changes in one or the other of said first and second signals when said common mode voltage changes;
   means for inverting one of said first and second signals, said first and second signals being thereby in-phase with one another; and
   disciminating means receiving said in-phase first and second signals for generating an output signal having first or second states, said discriminating means changing the state of said output signal only when both of said in-phase signals complement states wherein changes in one or the other of said first and second signals are ineffective to change said output signal state.

6. In a power switching system having a low level input logic control circuit and a high level output power switch control circuit wherein a variable common mode voltage exists between said input and output circuits, a common mode rejection coupler comprising:

a first circuit means for receiving an input signal and for generating a first signal in response thereto, said first circuit means normally isolating said first signal with respect to common mode voltage;

a second circuit means for receiving the complement of said input signal and for generating a second signal in response thereto, said second circuit means normally isolating said second signal with respect to said common mode voltage, said second signal having a state opposite that of said first signal;

means for inverting one of said first and second signals, said first and second signals thereby having the same state; and logic means receiving said first and second signals for generating an output having a first state when said first and second signals have a first state and for generating an output having a second state when said first and second signals have a second state, said logic means being ineffective to change output states when one of said first and second signals has a state opposite the other.

7. The circuit of claim 6 wherein said logic means comprises means for dividing said first and second signals by a predetermined amount, and bistable means responsive to said output of said voltage divider for generating a first output signal when the output of said divider means is greater than a predetermined value, and for generating a second output when said output of said divider means is less than a second value, said bistable remaining in its present state when the output of said divider means is between said first and second values.

8. The common mode rejection coupler of claim 7 wherein said first and second circuit means each comprises an optical isolator circuit having an input circuit for receiving said input signal, said input circuit including a light emitting diode and being referenced to a fixed ground; and an output circuit said output circuit including a light sensor diode for receiving the light generated from said light emitting diode and for generating a signal proportional to the intensity of said light, a common mode voltage existing between said input and said output circuits, said input and output circuits being capacitively coupled.

* * * * *